Nov. 19, 1968 W. J. McGINLEY 3,411,205

WELDABLE PRINTED CIRCUIT MAKING

Filed Jan. 27, 1965 2 Sheets-Sheet 1

INVENTOR

William J. McGinley

BY Kemon, Palmer, Stewart & Estabrook

ATTORNEYS.

WELDABLE PRINTED CIRCUIT MAKING

Filed Jan. 27, 1965 2 Sheets-Sheet 2

INVENTOR
William J. McGinley

BY Kemon, Palmer, Stewart & Estabrook
ATTORNEYS.

United States Patent Office 3,411,205
Patented Nov. 19, 1968

3,411,205

WELDABLE PRINTED CIRCUIT MAKING

William J. McGinley, Palatine, Ill., assignor to Methode Electronic, Inc., Chicago, Ill., a corporation of Illinois Filed Jan. 27, 1965, Ser. No. 428,467
2 Claims. (Cl. 29—625)

ABSTRACT OF THE DISCLOSURE

A method for making weldable printed circuit boards, and specific examples of printed circuit boards, made according to the method, are disclosed in the hereinafter specification. A prepunched base board is laminated to a prepunched film adhesive and a relatively thick, hard piece of metal foil. A circuit configuration is formed on the foil. Powdered rosin is applied and formed into a fused, thick mass on the circuit configured portions of the foil by subjecting the rosin to blasts of hot air. Etching acids are applied for a relatively long period of time, and the board is thereafter washed with a solvent to remove the fused rosin. Portions of the printed conductors are thereafter formed up as tabs to which components may be welded.

The present invention relates to printed circuit boards and particularly to circuit boards suited for use in any conventional electronic circuitry, and also capable of reliable and durable performance under extreme conditions of shock, vibration and other difficult environmental conditions.

It has long been believed that welding provides a more reliable and durable connection than soldering. Welded circuits also permit dense packaging and therefore exhibit superior shock and vibrational resistance than packages made up out of circuits utilizing soldered connections. Thus the weldable printed circuit is able to withstand the shock and vibrational forces experienced in difficult environmental conditions such as a rocket launch.

The prior art has been deficient in that although it has shown weldable printed circuits, those circuits generally have been fabricated by either electrical or mechanical means. For example, the prior art has taugh the attachment of materials that can withstand welding temperatures to the usual printed copper conductors where the conductors have been printed onto the base boards through the conventional etching process. The referred to method requires a metal to metal contact of a relatively soft metal and a relatively hard metal thereby requiring more manufacturing steps than would be required if only one metal were utilized. Consequently the processes taught and the articles produced thereby have been expensive in that they have required more time, labor and materials than the process and article of the present invention.

The prior art has also been deficient in that it does not show a method of producing substantially heavier foil or conductor thickness than is necessary where dip soldering is employed. A much heavier foil thickness is absolutely essential for a weldable circuit in order that good welded junctions can be achieved.

It is an object of this invention to provide a method for making weldable printed circuit boards where the entire printed pattern is made of a relatively hard conductive material having a thickness greater than that heretofore known.

It is another object of this invention to provide a method for making weldable printed circuit boards wherein the terminal portion of the conductors are formed up at an angle to the terminal boards so that components mounted on opposite sides of the terminal board may have their leads welded to the terminal tabs.

It is another object of this invention to provide a method for making a weldable printed circuit board that is inexpensive to produce and is susceptible to mass manufacturing techniques.

Still another object of the invention is to provide a printed circuit board which is extremely reliable in operation, more rugged in construction, highly adaptable to welding techniques, and economical to manufacture.

The novel features which are believed to be characteristic of the invention are set forth with particularity in the appended claims, but the invention will be best understood by reference to the following description taken in connection with the accompanying drawings in which:

Figures 1, 2, 5, 6, 7:
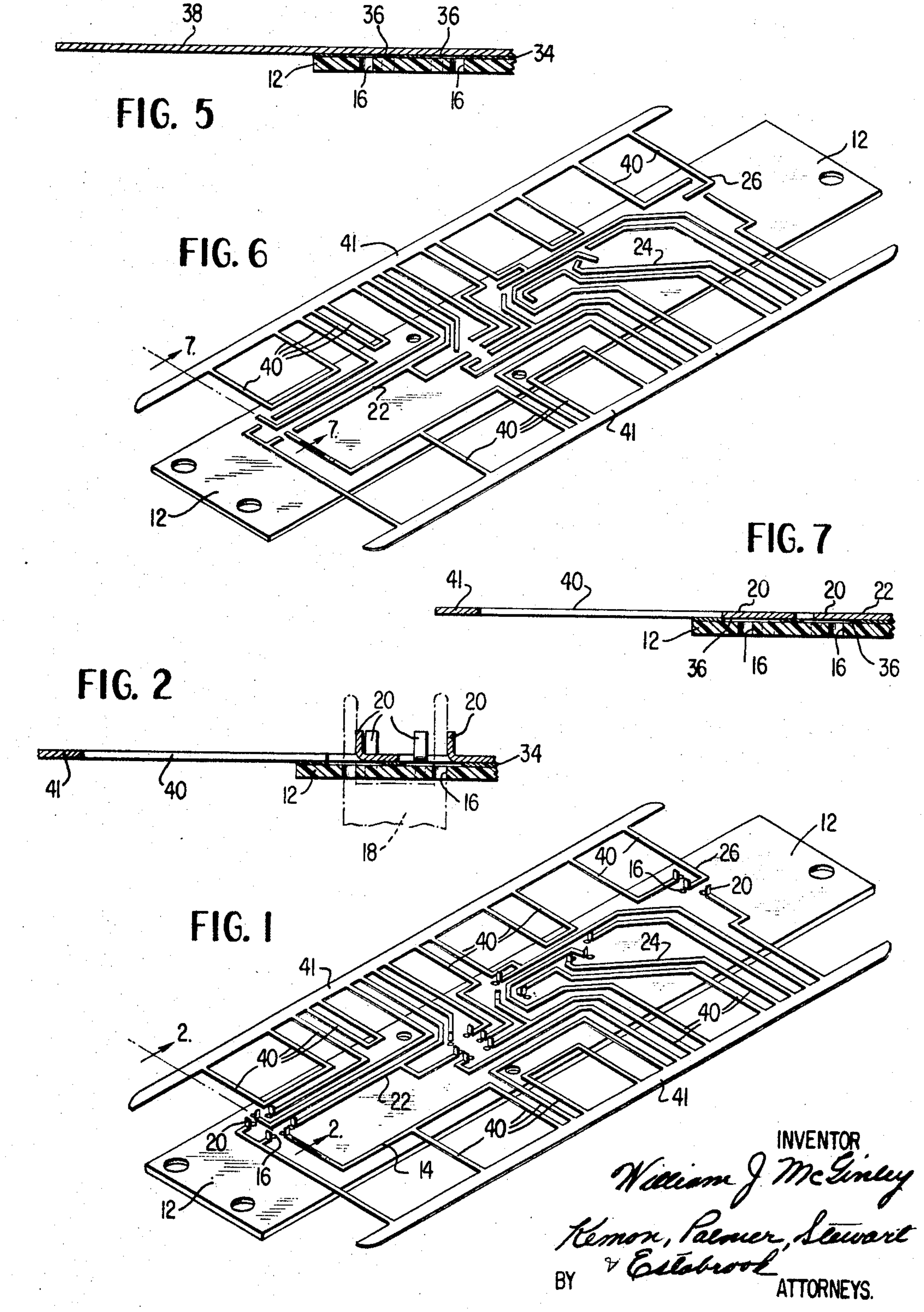
FIGURE 1 is a view of a weldable printed circuit board produced by the process taught by this invention.
FIGURE 2 is a sectional view taken along the line 2—2 of FIGURE 1.
FIGURE 5 is a sectional view of the laminate taken along the line 5—5 of FIGURE 4.
FIGURE 6 is a view of the weldable printed circuit board of this invention prior to the forming of the weldable tabs.
FIGURE 7 is a sectional view of the board shown in FIGURE 6 taken along the line 7—7.

Referring to the drawings and in particular to FIGURE 1, a printed circuit board is shown generally as having a rectangular outline and being composed of an insulating base board or backing board 12 carrying conductive circuits indicated generally at 14. The insulating board 12 is shown as having a plurality of spaced apertures designated as 16, which communicate between the upper and lower surfaces of the board 12, and are located at points where external connections are to be made to conductor portions carried by board 12. These apertures are designed to hold a plurality of component leads or wires as shown in FIGURE 2 where a circuit component 18 has been mounted on one side of the board 12 with its leads running through the apertures 16 to terminals 20 formed on the other side of the board 12. The conductive circuit portions of the printed circuit 14 such as 22, 24 and 26 terminate in the terminal tabs 20 located immediately adjacent the holes or apertures 16.

Figures 3, 4:
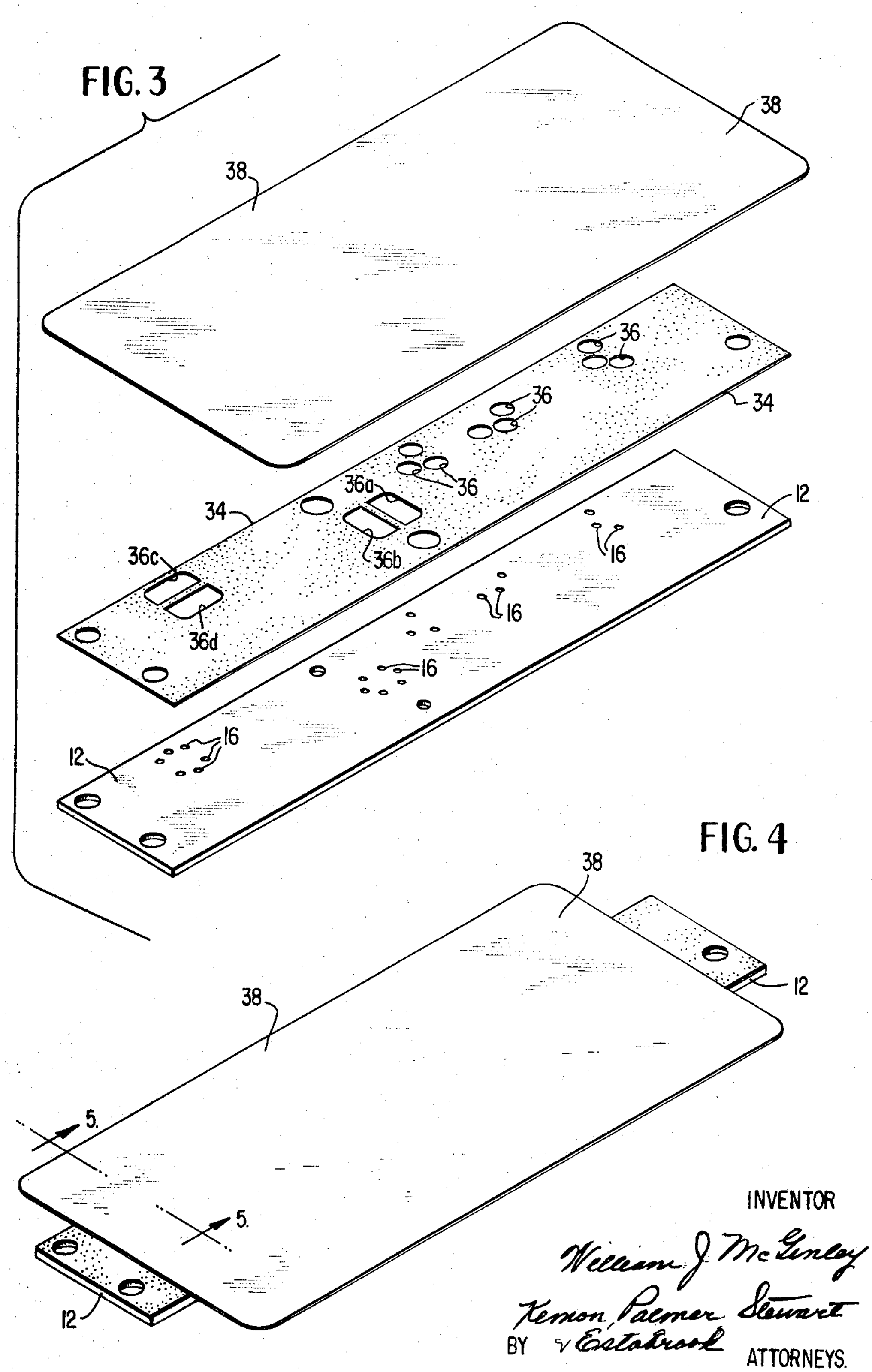
FIGURE 3 is an exploded view of the base board adhesive and metal foil used in this invention.
FIGURE 4 is a view showing the elements of FIGURE 3 laminated together.

Referring now to FIGURE 3, in accordance with a specific embodiment of the invention, a single layer of glass-reinforced dielectric material 12 has been prepunched with component holes 16 at locations determined by the desired circuit pattern. As stated heretofore with reference to FIGURES 1 and 2, the component holes 16 serve the purpose of allowing component leads or other external connection to be passed therethrough so that they may be welded to the tabs 20 of the final printed circuit board as shown in FIGURE 2. They serve a secondary purpose which will be explained subsequently. The actual substrate used for board 12 in this embodiment of the invention was $\frac{1}{32}$ of an inch thick glass epoxy insulating sheet or board.

In addition to substrates made of the glass-reinforced epoxy, other suitable dielectric materials may be used such as the extruded flurocarbons of the Teflon or Kel-F type or polyester film such as Mylar.

A thin sheet or film of adhesive 34 is also prepunched with clearance holes 36. The adhesive sheet 34 will eventually be laminated to the substrate board 12, thus it is necessary that the clearance holes 36 be punched or drilled in the same geometrical position as the component holes 16 in the substrate board 12 in order that the clearance holes 36 will register with the component holes 16 when the two pieces are laminated together. The clearance holes 36 should be substantially larger in area than the component holes 16 in order that adhesive material will be well clear of thermal effects generated by welding heat when the component leads are eventually welded to the printed circuit terminals, thus avoiding contamination of the welded circuit joints by the adhesive material. Where a group of apertures 16 are located close together, a single hole may serve for the entire group, as shown at 36*a*–36*b* and 36*c*–36*d*.

The metallic foil 38 out of which the circuit pattern will be produced is also shown in FIGURE 3. In one embodiment of this invention, the metallic foil 38 was composed of 99 percent pure nickel and is 0.007 inch thick. It is possible with the technique of this invention to produce printed circuits by etching using heavier nickel foil. Other materials that are equally successful for welding purposes and/or producing a printed circuit board through the use of a process disclosed by this invention are Nickel (D) comprising 93.7 percent minimum nickel and 5 percent manganese. Kovar (a registered trade name of the Westinghouse Corporation) composed of 29 percent nickel, 17 percent cobalt and 54 percent iron; Monel composed of 63.7 percent nickel, 2.5 percent maximum iron, 2 percent manganese, and 32 percent copper; and Constantin composed of 43 percent nickel and 57 percent copper.

One of the reasons for using the nickel foil dielectric laminates is that in applying the present invention such laminates do not have to withstand the thermal shock of dip soldering which is normally applied to printed circuit boards made from copper clad laminates.

Referring now to FIGURES 4 and 5, the base board 12 is shown laminated together with the adhesive sheet 34 and the nickel foil 38. The lamination is achieved through the application of heat and pressure to the three components and is known in the art. As shown in FIGURE 4, the nickel sheet 38 extends beyond the side edges of the board 12 for a purpose to be described.

The circuit to be printed on the foil 38 will be etched to a considerable depth over that permitted by the prior art. In the preferred embodiment of the invention, the circuit configuration or pattern is printed on the foil 38 as a wet adhesive coating by the usual silk screening techniques. The entire surface of the metal foil 38 is then covered with a heavy coating of powdered rosin. The rosin will adhere to the wet areas on the foil 38 where the wet areas correspond to the circuit to be printed. The excess rosin, that is to say the rosin covering the dry areas on the metal foil 38, is blown off or may be vacuumed off to be reused in the manufacture of other circuit boards.

The powdered rosin then piled on the wet printed image is fused into a mass of considerable thickness by subjecting the rosin and the foil 38 to blasts of hot air. The fused rosin has considerable durability and has the ability to withstand, for extended periods of time, the effects of etching acids. It is this particular step as taught by this invention that permits the construction of a printed circuit utilizing solid nickel conductors.

Etching acids are sprayed onto the thus-treated metal foil 38 at high velocity in order to remove the undesired metal portions of the foil. After the foil has been exposed to the etching acids for an extended period of time the adhesive coating and fused rosin may be stripped from the circuit board by techniques known in the art.

Referring now to FIGURES 6 and 7, it will be noted that the component holes 16 have been printed over with the end portions of nickel conductors 22, 24, and 26. In order to form the weldable tabs 20, see FIGURES 1 and 2, it is only necessary to insert a punch in each of the component holes 16, pass the punches through the clearance holes 36 and push the end portions of strips 22, 24, 26, etc. up until they form an angle of 90° with the circuit board 12, that is, the tabs 20 are formed perpendicular to the plane of the board 12. Thus the conductor 22 is terminated with a tab that can be welded to a component lead such as the lead of the component 18 in FIGURE 2 where the component is mounted on the reverse side of the board with its leads extending through the apertures 16 and 36.

In the embodiment shown in the drawing, the edge portions of the metal sheet 38 which extend beyond the side edges of the backing board 12 are used to form laterally extending terminal portions 40 for connection to outside components which are not mounted on the backing board 12. These laterally extending terminal portions 40 constitute a part of the circuit network and are formed by the same printing and etching process as the circuit strips carried by the board 12. These terminal portions 40 are arranged in parallel relation and spaced apart by distances suitable for mounting within notches formed in the edges of two parallel rails arranged on opposite sides of the board 12 according to the well known "rail" type of mounting base. In one known arrangement, the notches' rails are the side flanges of a channeled base formed of molded insulating plastic.

The ends of the terminal portions 40 on each side of the board 12, are held together by an integral stringer portion 41. These stringer portions hold the terminal portions 40 in proper relation during handling of the printed circuit unit and during mounting upon the "rail" support, and are cut off after being mounted on the rail support. It would be understood that the terminal extensions 40 project upon the rails and are available for welding to the connecting leads of components mounted on separate circuits from the board 12.

The present invention thus teaches a method and provides a circuit board having the advantages of high conductivity and weldable tabs that are integral extensions of the conductors used on the board and made of the same material as the conductors. By this means the circuit is made highly shock resistant, vibrationally resistant and thermally resistant.

Having thus described the invention, what I claim as new and desire to have patented is:

1. The method of making a weldable printed circuit board, the steps comprising:

(a) blanking a piece of insulating material to be used as a substrate to final size;

(b) punching said substrate with a plurality of holes to conform to circuit component configurations;

(c) punching a piece of film adhesive of substantially the same size as said substrate with clearance holes, said clearance holes registering in conformity with said component holes punched in said substrate, said clearance holes in said adhesive being larger than said component holes;

(d) laminating said substrate and adhesive together with a piece of relatively thick and hard metal foil;

(e) printing the desired image to be formed on said metal foil with a wet adhesive by the silk screen technique;

(f) sprinkling powdered rosin over the metal foil so that it adheres to the wet printed image thereon;

(g) removing the rosin from the dry areas of the foil by vacuuming or blowing;

(h) fusing said powdered rosin and adhesive into a mass of substantial thickness to thereby form a composite acid resist by subjecting said rosin and adhesive to a blast of hot air;

(i) etching the metal in a single plane by spraying etching acids at high velocity onto said foil so that strips of said metal substantially cover said punched holes;

(j) removing said resist; and (k) forming said metal strips up in a substantially perpendicular direction with the plane of the circuit board at the location of said component holes.

2. The method as defined by claim 1, in which said metal foil is selected from the group consisting of nickel, manganese, cobalt, iron, and copper.

References Cited

UNITED STATES PATENTS

| | | | |
|---|---|---|---|
| 437,306 | 9/1890 | Kraupa et al. | 156—13 |
| 2,695,351 | 11/1954 | Beck | 201—64 |
| 3,200,020 | 8/1965 | Schroeder | 156—3 |

JACOB H. STEINBERG, *Primary Examiner.*